(12) United States Patent
Iwase et al.

(10) Patent No.: US 10,274,671 B2
(45) Date of Patent: Apr. 30, 2019

(54) FIBER STRUCTURAL BODY AND LIGHT SOURCE DEVICE

(71) Applicant: CANON KABUSHIKI KAISHA, Tokyo (JP)

(72) Inventors: Hideo Iwase, Kunitachi (JP); Yukihiro Inoue, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/922,655

(22) Filed: Mar. 15, 2018

(65) Prior Publication Data

US 2018/0203182 A1  Jul. 19, 2018

Related U.S. Application Data

(63) Continuation of application No. 15/584,522, filed on May 2, 2017, now Pat. No. 9,946,015.

(30) Foreign Application Priority Data

May 6, 2016 (JP) .................................. 2016-093153

(51) Int. Cl.
| | | |
|---|---|---|
| G02B 6/02 | (2006.01) | |
| F21V 8/00 | (2006.01) | |
| H01S 5/14 | (2006.01) | |
| G02B 6/38 | (2006.01) | |
| G02F 1/365 | (2006.01) | |
| G02F 1/39 | (2006.01) | |

(Continued)

(52) U.S. Cl.
CPC ....... *G02B 6/02338* (2013.01); *G02B 6/0005* (2013.01); *G02B 6/0006* (2013.01); *G02B 6/0008* (2013.01); *G02B 6/02347* (2013.01); *G02B 6/3855* (2013.01); *G02F 1/365* (2013.01); *G02F 1/39* (2013.01); *H01S 5/141* (2013.01); *H01S 3/0092* (2013.01); *H01S 3/067* (2013.01)

(58) Field of Classification Search
CPC .......................... G02B 6/02338; G02B 6/0005
See application file for complete search history.

(56) References Cited

U.S. PATENT DOCUMENTS 7,813,387 B2 * 10/2010 Pedersen ............... H01S 3/1115
372/10
8,422,839 B2 * 4/2013 Sakamoto .......... G02B 6/02333
385/123

(Continued)

FOREIGN PATENT DOCUMENTS

| JP | S57-110523 U | 7/1982 |
|---|---|---|
| JP | 2004-272026 A | 9/2004 |

(Continued)

*Primary Examiner* — Sung H Pak
(74) *Attorney, Agent, or Firm* — Canon U.S.A. Inc., IP Division

(57) ABSTRACT

A fiber structural body includes a first fiber, and a second fiber spliced to the first fiber such that light having propagated through the first fiber propagates through the second fiber. At least one of the fibers is a photonic crystal fiber. The second fiber is coated with a first coating layer and a second coating layer in order from a splice surface, and the first coating layer has a refractive index $n_1$ larger than that of a clad layer of the second fiber. In the fiber structural body, L, r, $n_1$, and NA satisfy a particular relationship.

7 Claims, 5 Drawing Sheets

(51) Int. Cl.
*H01S 3/067* (2006.01)
*H01S 3/00* (2006.01)

(56) References Cited

U.S. PATENT DOCUMENTS

| | | | | |
|---|---|---|---|---|
| 9,640,940 | B2* | 5/2017 | Gu | H01S 3/0057 |
| 2004/0008955 | A1* | 1/2004 | Patlakh | G02B 6/02385 |
| | | | | 385/95 |
| 2004/0052485 | A1* | 3/2004 | Van Eijkelenborg | ............... |
| | | | | G02B 6/02033 |
| | | | | 385/125 |
| 2004/0263950 | A1* | 12/2004 | Fermann | H01S 3/0057 |
| | | | | 359/333 |
| 2006/0209908 | A1* | 9/2006 | Pedersen | H01S 3/1115 |
| | | | | 372/6 |
| 2009/0092365 | A1* | 4/2009 | Donlagic | G02B 6/0288 |
| | | | | 385/124 |
| 2009/0201953 | A1* | 8/2009 | Peyghambarian | C03B 37/0122 |
| | | | | 372/6 |
| 2010/0232745 | A1* | 9/2010 | Stacey | G02B 6/02314 |
| | | | | 385/28 |
| 2010/0265514 | A1* | 10/2010 | Villatoro | G02B 6/02338 |
| | | | | 356/477 |

FOREIGN PATENT DOCUMENTS

| | | |
|---|---|---|
| JP | 2005-303166 A | 10/2005 |
| JP | 2011-211220 A | 10/2011 |

* cited by examiner

FIBER STRUCTURAL BODY AND LIGHT SOURCE DEVICE

CROSS-REFERENCE TO RELATED APPLICATION

This application is a Continuation of U.S. application Ser. No. 15/584,522, filed May 2, 2017, which claims priority from Japanese Patent Application No. 2016-093153 filed May 6, 2016, each of which are hereby incorporated by reference herein in their entireties.

BACKGROUND OF THE INVENTION

Field of the Invention

The present disclosure relates to a fiber structural body and a light source device.

Description of the Related Art

Wavelength-variable pulsed light sources and broadband-region pulsed light sources using parametric wavelength conversion in a highly-nonlinear fiber have been studied as light sources for medical imaging devices, such as spectrally encoded endoscope, optical coherence tomographic devices, and stimulated Raman microscopes. When pulsed light having high peak intensity propagates through a highly-nonlinear fiber, a wavelength of the pump light is converted into pulsed light having a different wavelength by optical nonlinear effects. Examples of a highly-nonlinear fiber for such wavelength conversion includes a photonic crystal fiber (hereinafter referred to as a PCF) having a periodical micro structure therein which can be seen on a cross section surface thereof. The use of the PCF enables intense light to be trapped inside a core by the periodical micro structure which can be seen on the cross section surface of the PCF. The high intensity of light acquired by trapping the light inside the core can provide a higher wavelength conversion efficiency which is required for a wavelength conversion pulsed light source. Moreover, in the PCF, dispersion characteristic thereof can be controlled by a change in a shape of the periodical micro structure. A wavelength of wavelength conversion pulsed light generated by propagation through a highly-nonlinear fiber is generally determined according to wavelength dependency of group velocity dispersion in the highly-nonlinear fiber. The PCF facilitates adjustment of the group velocity dispersion by a change in a shape of the periodical micro structure thereof. Accordingly, selection of an appropriate PCF in consideration of a wavelength of incident pulsed light enables wavelength conversion pulsed light having a desired wavelength to be generated. Moreover, pulsed light having a pulse width of 100 ps or less is often used as pump light. When the pulsed light having a pulse width of 100 ps or less is used, high peak intensity that is necessary to achieve optical nonlinear effects can be acquired.

A method for causing pulsed light to enter a PCF and a method for transmitting the pulsed light to a medical imaging device from the PCF are as follows: a PCF and any of a single mode fiber, a multi-mode fiber, and a double-clad fiber (hereinafter, these fibers are collectively referred to as general fibers) are fusion spliced. Pulsed light output from a pulsed light source passes through these general fibers and enters the PCF via a fusion splice. Moreover, the pulsed light and wavelength conversion pulsed light emitted from the PCF can enter the general fiber via the fusion splice, and then be transmitted to a medical imaging device through the general fiber. A method for fusion splicing the PCF and the general fibers is discussed in Journal of Lightwave Technology, Vol. 25, No. 11, pp. 3563-3574, November 2007. A core diameter of the PCF is determined according to a dispersion curve that is needed for wavelength conversion of the pulsed light. Moreover, a general fiber serving as an output terminal of a pulsed light source and a general fiber serving as an input terminal of a medical imaging device are appropriately selected from general fibers according to specifications of the light source and the device. Thus, in general, the PCF and the general fiber which are fusion spliced have different mode field diameters (MFD representing a diameter of light to propagate through a fiber). In Journal of Lightwave Technology, Vol. 25, No. 11, pp. 3563-3574, November 2007, weak discharge is performed for a plurality of times in a fusion splice to melt the glass material (generally, quartz) of the PCF, and a diameter of periodic holes to be fabricated on a cross section surface of the PCF is adjusted, so that the MFD of the PCF is adjusted. According to such a method, the MFD of the PCF is adjusted near the fusion splice. The PCF and the general fiber which normally have different MFDs can be therefore fusion spliced. According to such a fusion method, a high splicing efficiency that is 50% to 90% or more with respect to the pulsed light can be acquired. Herein, the term "splicing efficiency" used herein represents a ratio of $P_1/P_0$, where $P_0$ is a power of light propagating through a core of a first fiber, and $P_1$ is a power of light propagating through a core of a second fiber, assuming that the first fiber and the second fiber are optically spliced and light propagates from the first fiber toward the second fiber. A difference between the powers (i.e., $P_0-P_1$) represents a power of leakage light from a fusion splice.

However, in a case where a general fiber and a PCF are fusion spliced by such a method in a wavelength conversion pulsed light source, a breakage of a coating layer for protecting the general fiber and the PCF can occur. FIG. 5A illustrates a sectional view of a fusion splice between the PCF and the general fiber as seen from side. The fusion splice between the PCF and the general fiber is coated with ultraviolet (UV) curing resin to increase strength thereof. Fiber recoaters as devices for coating a fusion splice with UV curing resin are available from fiber manufacturers and fusion machine manufacturers, such as Fujikura Ltd. and Vytran LLC. The fusion splice is recoated with the UV curing resin by a recoater, so that the general fiber and the PCF are smoothly coated with a coating layer generally having a diameter of 0.25 mm. In a case where pulsed light enters the fusion splice in a wavelength conversion pulsed light source, light leaking from the fusion splice can cause a breakage of the coating layer of the general fiber and the PCF.

Hereinafter, a mechanism of coating layer breakage is described with reference to the drawings. FIG. 5B illustrates cross-sectional light intensity distribution of light propagating through a single mode fiber (SMF) and a PCF. The cross-sectional light intensity distribution of the light in the SMF is unimodal, and is generally approximated as Gaussian distribution. On the other hand, the cross-sectional light intensity distribution of the light in the PCF exhibits distribution of light in a fringe shape on the periphery of a core. Thus, the cross-sectional light intensity distribution of the light in the PCF can be adjusted by changing a diameter of a hole on the cross section. However, the cross-sectional light intensity distribution of the light in the PCF does not exactly match the cross-sectional light intensity distribution of the light in the SMF. As a result, among pulsed light to enter from the SMF, approximately 10% to 50% of the pulsed light does not enter the core of the PCF. Consequently, such pulsed light becomes leakage light. In general, a power of the leakage light generated in a fusion splice is larger as a difference between an MFD (approximately 3 μm to 6 μm) of a PCF and an MFD of a general fiber is larger. Hence, in a case where the PCF and a multi-mode fiber or a double clad fiber are fusion spliced, a power of leakage light tends to be larger. According to measurements conducted by Inventor, leakage light from a fusion splice between a PCF and a general fiber increases with an increase in peak intensity of propagating pulsed light. It is conceivable that a refractive index which is received by the pulsed light is changed by nonlinear effects inside cores of the general fiber and the PCF, and changes in MFDs thereof cause such an increase in the leakage light.

Moreover, the pulsed light having high peak intensity has a spectrum width that is broadened by the nonlinear optical effects inside the cores of the general fiber and the PCF. With the method for adjusting the MFD in the PCF by changing the hole of the PCF, it is difficult to match the MFD of the PCF and an MFD of the general fiber each other. Accordingly, the fusion splicing efficiency is further lowered with respect to the pulsed light with the spectrum width broadened by the nonlinear optical effects. Meanwhile, a loss of when continuous wave light (CW light) enters a fusion splice between an SMF and an SMF is approximately 0.05 dB or less (approximately 1.1% or less). Therefore, in a case where the pulsed light enters the fusion splice between the PCF and the general fiber, it is conceivable that leakage light that is greater than 10 times of that generated when the CW light enters the fusion splice between the SMF and the SMF (leakage light that is approximately 10% to 50% with respect to a power of incident light is generated).

Some leakage light from the fusion splice propagates through the coating layer. For the coating layer in general, resin that is flexible with respect to bending is selected such that a fiber can be flexibly bent, and transmittance of visible light and near-infrared light through the resin is not high (50%/mm or less). Consequently, the leakage light is absorbed by the coating layer, and a breakage of the coating layer can occur due to generation of heat. Accordingly, in a case where the pulsed light enters the fusion splice between the PCF and the general fiber, the leakage light from the fusion splice causes a breakage of the coating layer of the PCF and the general fiber.

SUMMARY OF THE INVENTION

According to an aspect of the present disclosure, a fiber structural body includes a first fiber and a second fiber spliced to the first fiber such that light that has propagated through the first fiber propagate through the second fiber, wherein at least one of the first fiber and the second fiber is a photonic crystal fiber, wherein the second fiber is coated with a first coating layer and a second coating layer in order from a splice surface between the first optical fiber and the second optical fiber, wherein the first coating layer has a refractive index $n_1$ that is larger than a refractive index of a clad layer of the second fiber, and wherein a relational expression of $L > (r \times n_1)/NA$ is satisfied, where NA is a numerical aperture of the first fiber, r is a radius of the second coating layer with a center of the second fiber as an origin point, and L is a distance between the splice surface and an end of the first coating layer.

Further features will become apparent from the following description of exemplary embodiments with reference to the attached drawings.

DESCRIPTION OF THE EMBODIMENTS

A wavelength conversion pulsed light source according to one aspect of an exemplary embodiment employs a fiber splicing structure as follows. In the fiber splicing structure, a first fiber and a second fiber, at least one of which is a photonic crystal fiber, are fusion spiced. The second fiber is coated with a first coating layer and a second coating layer in the order from a splice surface between the first fiber and the second fiber. The first coating layer has a refractive index $n_1$ that is greater than a refractive index of a clad layer of the second fiber, and a relational expression of $L > (r \times n_1)/NA$ is satisfied. In the wavelength conversion pulsed light source, a pulsed light source that outputs pulsed light is optically connected to such a fiber splicing structure, so that the pulsed light propagates through the first fiber and then the second fiber. It is desirable that a relational expression of $R > (L \times NA)/n_1$ is satisfied to effectively prevent or reduce a breakage of the coating layer.

Figure 1A:
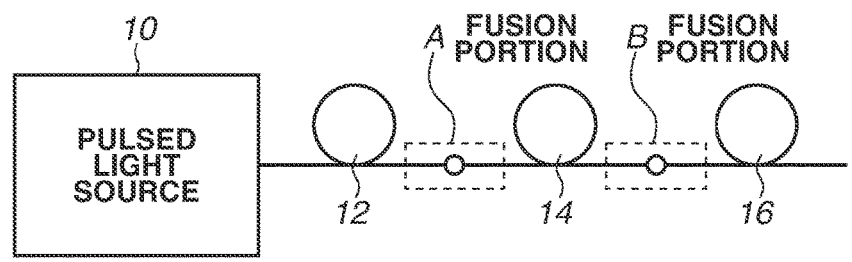
FIGS. 1A and 1B are schematic diagrams illustrating a broad-band-region light source according to an exemplary embodiment.
Figure 1B:
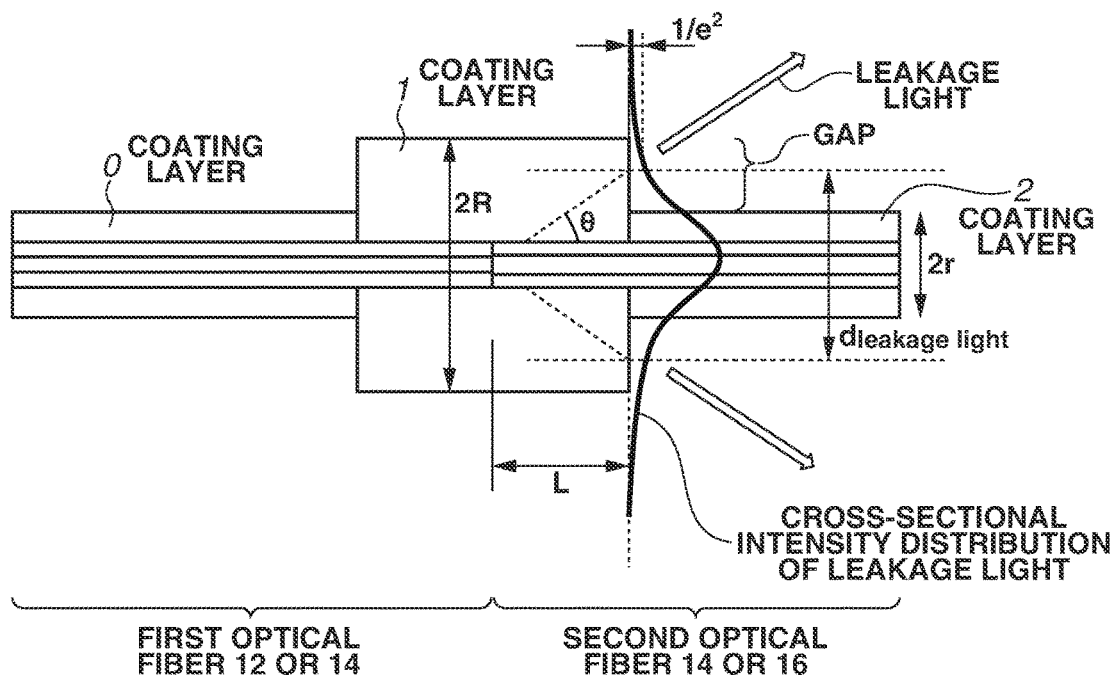

Hereinafter, one example of a broad-band-region light source according to the exemplary embodiment is described with reference to FIGS. 1A and 1B. FIG. 1A is a schematic diagram illustrating a configuration of a wavelength conversion pulsed light source, and FIG. 1B is a sectional view illustrating a fusion splice included in the wavelength conversion pulsed light source. The wavelength conversion pulsed light source includes a pulsed light source 10, a first optical fiber, and a second optical fiber. The pulsed light source 10 generates pulsed light. In each of fusion splice portions A and B, the first optical fiber and the second optical fiber are fusion spliced. One of the first optical fiber and the second optical fiber is a PCF, and the other is a general fiber. That is, in the fusion splice portion A illustrated in FIG. 1A, a general fiber 12 serves as the first optical fiber, and a PCF 14 serves as the second optical fiber. In the fusion splice portion B, the PCF 14 serves as the first optical fiber, and a general fiber 16 serves as the second optical fiber.

The pulsed light source 10 outputs the pulsed light. After propagating through the first optical fiber, the pulsed light enters the second optical fiber from a fusion splice (a fusion splice surface or a splice surface). The first optical fiber and the second optical fiber are respectively coated with a coating layer 0 and a coating layer 2 (a second coating layer). One portion of the coating layer 0 of the first optical fiber and one portion of the coating layer 2 of the second optical fiber which is disposed opposite the first optical fiber with the fusion splice point therebetween are removed, and these removed portions are coated with a coating layer 1 (a first coating layer). The coating layer 1 covers the first optical fiber between the fusion splice and the coating layer 0, and the second optical fiber between the fusion splice and the coating layer 2. The coating layer 1 has a refractive index $n_1$ that is higher than a refractive index $n_0$ of a clad layer of the second optical fiber. Such arrangement is made to effectively guide leakage light that could not enter the second optical fiber from the first optical fiber to the coating layer 1. Herein, if the second optical fiber is a PCF, a clad layer of the PCF is an area without a periodic structure which can be seen in a cross section of the PCF. That is, a refractive index $n_0$ of the clad layer of the PCF represents a refractive index of the glass material that forms the PCF. Further, transmittance of the coating layer 1 with respect to the pulsed light is higher than transmittance of the coating layer 2 to the pulsed light. Such arrangement is made to reduce heat generated by absorption of the leakage light by the coating layer 1.

For example, the coating layer 1 includes at least one of UV curing resin that includes any of acryl resin, epoxy resin, and high-refractive-index polymer, polycarbonate, and sapphire. That is, the UV curing resin includes at least one of acryl resin, epoxy resin, and high-refractive-index polymer, and the coating layer 1 includes at least one of such UV curing resin, polycarbonate, and sapphire. These components are generally available and relatively less expensive.

Pulsed-light that has not entered a core of the coating layer 2 at the fusion splice (i.e., leakage light) propagates through the coating layer 1 while having a divergence angle $\theta$, and then reaches the coating layer 2. The divergence angle $\theta$ of the pulsed light in the coating layer 1 has a relationship with a divergence angle $\theta_{air}$ in the air as follows.

$$\sin\theta/\sin\theta_{air} = \sin\theta/NA = 1/n_1$$

In the equation, NA $(=\sin\theta_{air})$ is a numeral aperture (NA) of the first optical fiber. A divergence diameter $d_{leakage\ light}$ of the leakage light in the coating layer 2 is expressed as follows:

$$d_{leakage\ light} \approx 2L \times \sin\theta = (2L \times NA)/n_1,$$

where L is a distance between the fusion splice and an end of the coating layer 2.

Assume that a radius of the coating layer 1 with the center of the second optical fiber as an origin point is R, and a radius of the coating layer 2 with the center of the second optical fiber as the origin point is r. Herein, leakage light propagates while reflection thereof from a surface of the coating layer 1 is being suppressed, and then is released outside the coating layer 2. A condition of such release is expressed as follows.

$$d_{leakage\ light} > 2r$$

Moreover, $R > d_{leakage\ light}/2$ is desirable.

Therefore, L and R satisfying the above conditions are expressed as follows.

$$L > (r \times n_1)/NA$$

Moreover, $R > (L \times NA)/n_1$ is desirable.

If such a conditional expression is satisfied, the leakage light released from the fusion splice propagates while diverging inside the coating layer 1 and reaches an end of the coating layer 2. Transmittance of the leakage light through the coating layer 1 is higher than transmittance of the leakage light through the coating layer 2, so that a breakage of the coating layer 1 is prevented because of lesser absorption of the leakage light propagating through the coating layer 1. Further, some of the leakage light, which has reached the end of the coating layer 2, is released outside from a gap between the coating layer 1 and the coating layer 2. Thus, a power of the leakage light entering the coating layer 2 is lowered, and a breakage of the coating layer 2 is prevented. Accordingly, such a theory works regardless of whether the first optical fiber is any of a PCF and a general fiber.

Hereinafter, the exemplary embodiment is described in more detail with reference to the drawings.

Figure 2A:
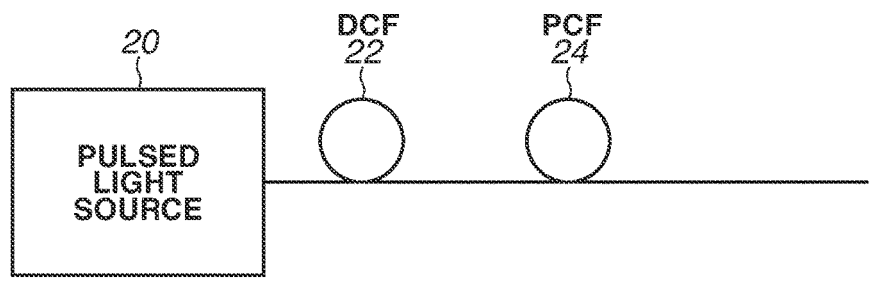
FIGS. 2A and 2B are schematic diagrams illustrating a wavelength conversion pulsed light source according to a first exemplary embodiment.

FIG. 2A is a schematic diagram illustrating a wavelength conversion pulsed light source according to the first exemplary embodiment. A pulsed light source 20 includes a fiber laser and an amplifier. The fiber laser uses an Ytterbium (Yb) doped fiber as a gain medium, and outputs pulsed light by using mode locking. The amplifier uses an Yb-doped fiber as a medium. The pulsed light source 20 outputs the pulsed light from a double clad fiber (DCF) 22 having a core diameter of 10 μm. In the present exemplary embodiment, the DCF is DCF-UN-10/125-08 manufactured by Core Active Co. Ltd., and has a NA of 0.08. The pulsed light has a central wavelength of 1030 nm, a spectral width of 0.5 nm, a pulse width of 3 ps, a repetition frequency of 30 MHz, and an average output of 2 W.

A PCF 24 performs conversion of a wavelength of pulsed light. In the present exemplary embodiment, the PCF 24 is SC-5.0-1040 manufactured by NKT Photonics, and has a length of 0.3 m. Some pump pulsed light that propagates through the PCF is converted into a wavelength conversion pulsed light having a wavelength of approximately 800 nm based on the principle of fiber optical parametric amplifier (FOPA). The pulsed light and the wavelength conversion pulsed light are taken out as outputs of the wavelength conversion pulsed light source from the PCF 24. The DCF 22 and the PCF 24 are fusion spliced under an intermittent fusion condition discussed in Journal of Lightwave Technology, Vol. 25, No. 11, pp. 3563-3574, November 2007. Under the intermittent fusion condition, fibers are fusion spliced using electric discharge that is weaker than that used in a normal fiber fusion splice condition, so that the fibers are fusion spliced in a state in which a shape of a hole of the PCF is maintained to some extent.

Figure 2B:
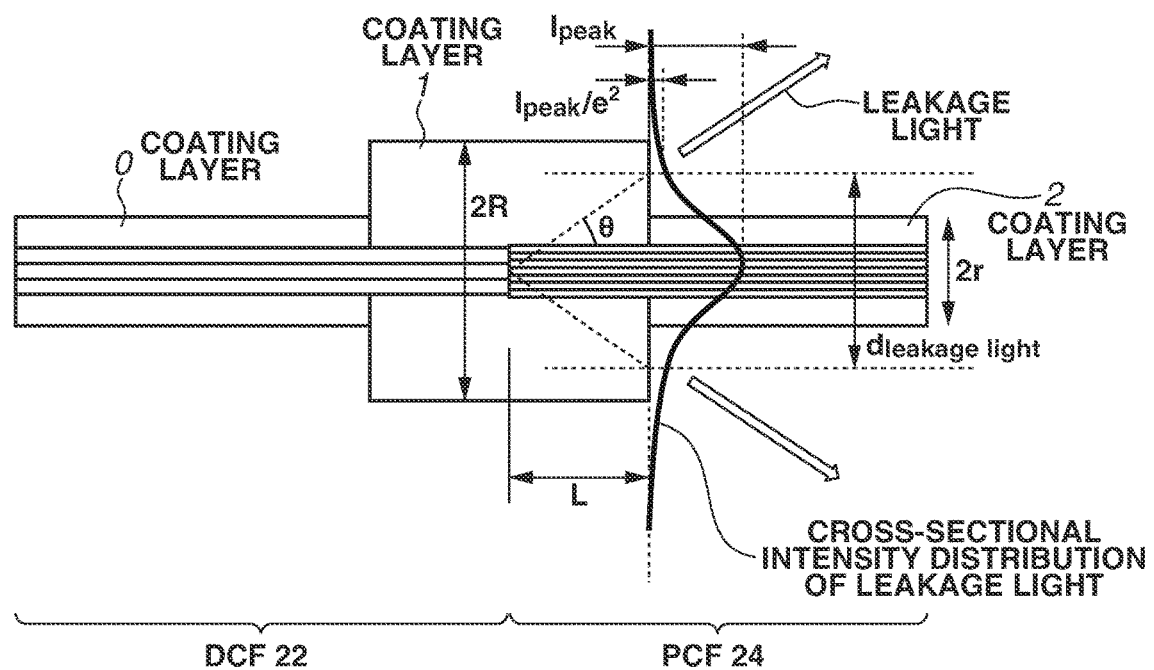

FIG. 2B is a sectional view illustrating a fusion splice between the DCF 22 and the PCF 24. A coupling efficiency of the pulsed light from a core of the DCF 22 to a core of the PCF 24 is approximately 70%. The DCF 22 and the PCF 24 with the fusion splice therebetween are coated with high-refractive-index transparent resin which is the coating layer 1. The distance L between the fusion splice coated with the coating layer 1 and the end of the coating layer 2 is 4 mm, and the radius R of the coating layer 1 is 0.5 mm. Each of the coating layer 0 of the DCF 22 and the coating layer 2 of the PCF 24 has transmittance of 50%/mm or less with respect to a wavelength of the pulsed light. The coating layer 2 of the PCF 24 has a diameter 2r of 0.25 mm (r=0.125 mm). The PCF 24 includes silica glass of a glass material, and a refractive index thereof with respect to the pulsed light is 1.45. That is, a clad of the PCF 24 has a refractive index of 1.45. The high-refractive-index transparent resin of the coating layer 1 can be Lumiplus manufactured by Ryoko Chemical Co., Ltd. The Lumiplus can be molded by UV curing. The coating layer 1 has a refractive index $n_1=1.65$ and transmittance of 80%/mm or more with respect to a wavelength of pump pulsed light. More desirably, the coating layer 1 has transmittance of 90%/mm or more to prevent generation of heat. The refractive index of the coating layer 1 is greater than that of the glass material of the PCF 24, and the transmittance of the coating layer 1 is higher than that of the coating layer 2.

Since $(r \times n_1)/NA$ is 2.6 mm, it is shorter than the distance L (=4 mm). Moreover, $(L \times NA)/n_1$ is 0.19 mm and thus it is smaller than the radius R (=0.5 mm) of the coating layer 1. Also, the divergence diameter $d_{leakage\ light}$ of the leakage light in the end of the coating layer 2 is 0.38 mm, and it is thus larger than the diameter d (=0.25 mm) of the coating layer 2. Accordingly, the leakage light which does not overlap a cross section surface of the coating layer 2 in the end of the coating layer 2 is released outside from a gap between the coating layer 1 and the coating layer 2. The divergence diameter of the leakage light is defined by a diameter with a power density that is reduced to $1/e^2$ times with respect to a distribution peak.

With the pulsed light source of the first exemplary embodiment, the leakage light (a power of approximately 0.6 W) generated in the fusion splice between the PCF and the DCF propagates while diverging inside the coating layer 1 having high transmittance. Then, reflection of the leakage light from a surface of the coating layer 1 is suppressed, and the leakage light reaches an end of the coating layer 2. Some of the leakage light is released outside from a gap between the coating layer 1 and the coating layer 2. Thus, a power density of the leakage light to be absorbed (a density of the power of the leakage light to be absorbed) by the coating layer 1 and the coating layer 2 is reduced. As a result, breakages of the coating layer 1 and the coating layer 2 due to generation of heat can be prevented.

Figure 3A:
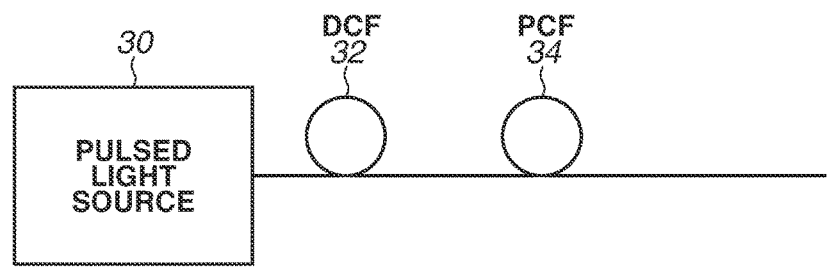
FIGS. 3A and 3B are schematic diagrams illustrating a pulsed light source according to a second exemplary embodiment.

FIG. 3A is a schematic diagram illustrating a pulsed light source according to a second exemplary embodiment. A pulsed light source 30 includes a fiber laser and an amplifier. The fiber laser uses an Yb-doped fiber as a gain medium, and outputs pulsed light by using mode locking. The amplifier uses an Yb-doped fiber as a medium. Pump pulsed light is output from a DCF 32 having a core diameter of 10 μm. In the present exemplary embodiment, the DCF 32 is DCF-UN-10/125-08 manufactured by Core Active Co. Ltd., and has a NA of 0.08. The pump pulsed light has a central wavelength of 1030 nm, a spectral width of 1 nm, a pulse width of 3 ps, a repetition frequency of 30 MHz, and an average output of 5 W. A PCF converts a wavelength of the pulsed light. In the present exemplary embodiment, the PCF 34 is SC-3.7-975 manufactured by NKT Photonics and has a length of 1.5 m. When the pulsed light propagates through the PCF 34, some of the pulsed light is converted into broad band region light having a wavelength of 480 nm to 1800 nm based on the principle of supercontinuum generation.

The pulsed light and the wavelength conversion pulsed light are taken out as outputs of the wavelength conversion pulsed light source from the PCF 34. The DCF 32 and the PCF 34 are fusion spliced according to the intermittent fusion condition discussed in Journal of Lightwave Technology, Vol. 25, No. 11, pp. 3563-3574, November 2007. A coupling efficiency of the pulsed light from a core of the DCF 32 to a core of the PCF 34 is approximately 60%. That is, an average power of the leakage light is estimated to approximately 2 W (=$P_{leakage\ light}$). Experimentally, if a power of the leakage light entering a coating layer 2 exceeds 1 W, breakage probability is extremely high. Accordingly, in power density distribution of the leakage light in an end of the coating layer 2, the power (an oblique-lined area in FIG. 3B) overlapping a cross section surface of the coating layer 2 is preferably 1 W or less.

Figure 4A:
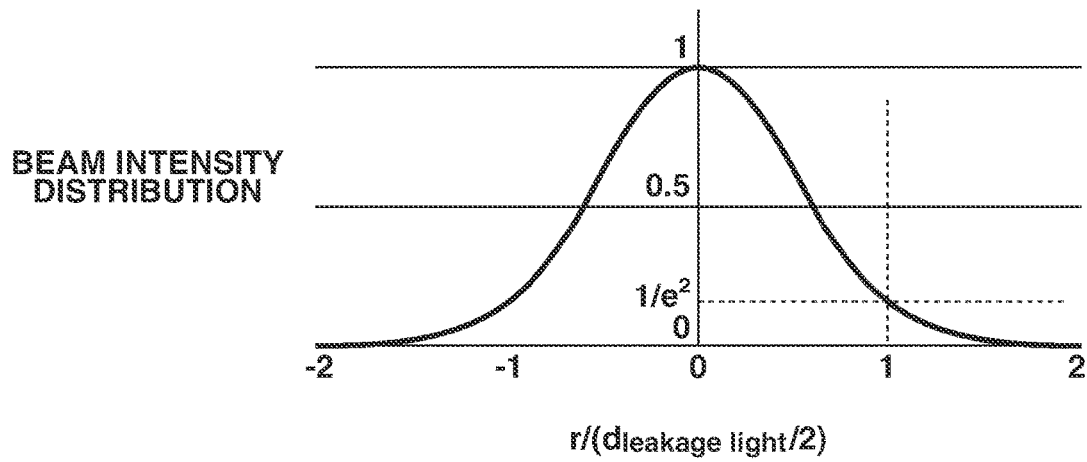
FIGS. 4A and 4B are graphs illustrating leakage light of the pulsed light source according to the second exemplary embodiment.

Intensity distribution of the leakage light released from a fusion splice in the end of the coating layer 2 is described by an NA of the DCF 32. FIG. 4A illustrates power density distribution (Gaussian distribution) of the leakage light in the end of the coating layer 2. A radius with a power density that is reduced to $1/e^2$ times with respect to a distribution peak represents divergence of the leakage light, and a divergence angle θ and the NA of the DCF 32 has a relationship of sin θ/NA=$1/n_1$. Thus, a divergence diameter of the leakage light is $d_{leakage\ light}/2 \approx (L \times NA)/n_1$.

In the power density distribution illustrated in FIG. 4A, a power $P_{in}$ entering a cross section surface (a radius r) of the coating layer 2 is expressed by Expression (1) as follows.

$$P_{in} = P_{leakage\ light}\left\{1 - \exp\left[-2\left(\frac{r}{d_{leakage\ light}/2}\right)^2\right]\right\} = \\ P_0(1-\alpha)\left\{1 - \exp\left[-2\left(\frac{r}{L(NA/n_1)}\right)^2\right]\right\} \quad (1)$$

In the equation, $P_0$ is a power of pulsed light propagating through a first optical fiber, and a is a coupling efficiency between the first optical fiber and a second optical fiber. $P_{in}$ is desirably 1 W or less to prevent a breakage of the coating layer 2.

Figure 4B:
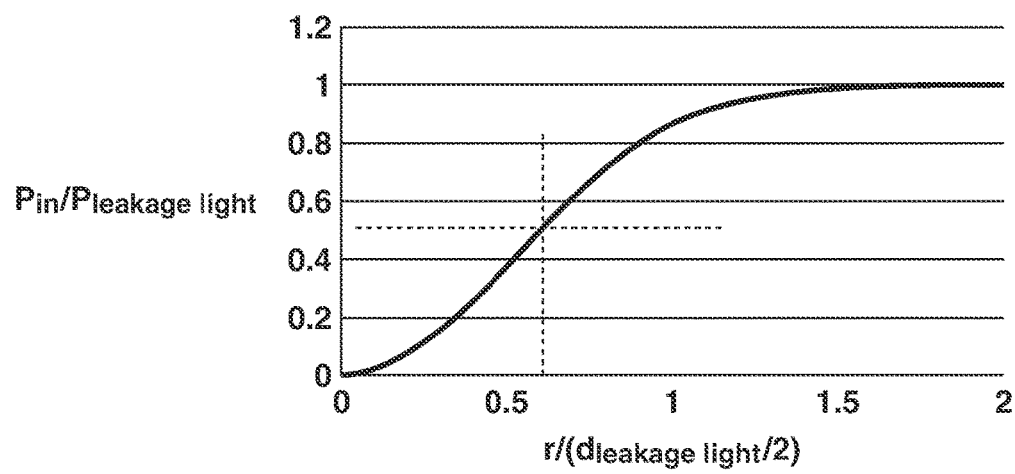
Figure 5A:
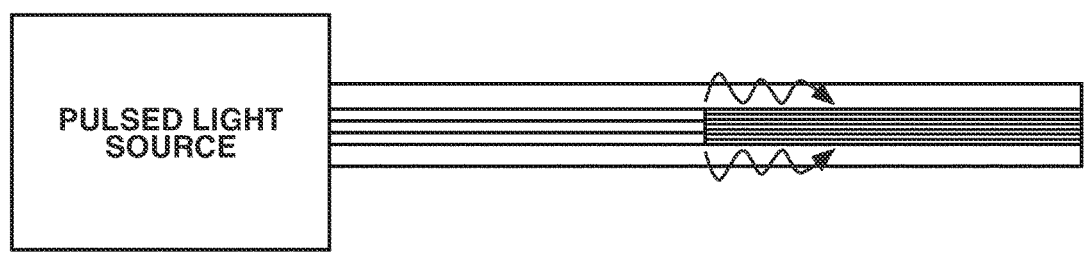
FIGS. 5A and 5B are diagrams illustrating an issue addressed herein.
Figure 5B:
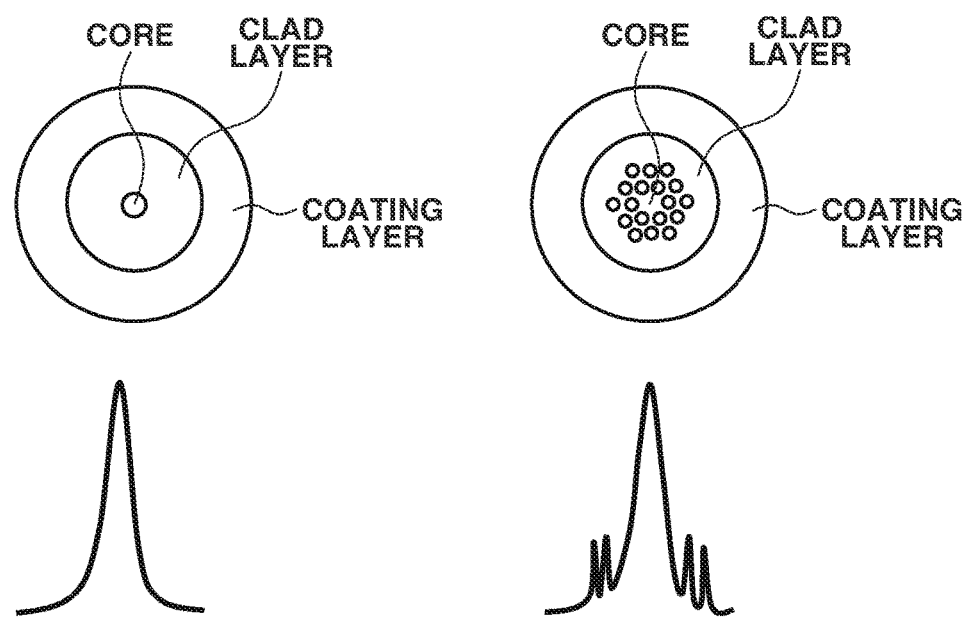

FIG. 4B is a graph in which $P_{in}/P_{leakage\ light}$=1−exp$[(-2(r/(d_{leakage\ light}/2))^2]$ is plotted with respect to $r/(d_{leakage\ light}/2)$. Since $P_{leakage\ light}$ is 2 W, $P_{in}$ is 1 W or less if $P_{in}/P_{leakage\ light}$ is 0.5 or less. Therefore, $2r/d_{leakage\ light}$ can be 0.6 or less according to the graph. That is, it is desirable that $d_{leakage\ light}$ is greater than 2r/0.6.

The DCF 32 and the PCF 34 with a fusion splice therebetween are coated with high-refractive-index transparent resin of a coating layer 1. A distance L between the fusion splice coated with the coating layer 1 and an end of the coating layer 2 is 9 mm, and a radius R of the coating layer 1 is 1.0 mm. Each of a coating layer 0 of the DCF 32 and the coating layer 2 of the PCF 34 has transmittance of 50%/mm or less with respect to a wavelength of the pulsed light. The coating layer 2 of the PCF 34 has a diameter 2r of 0.25 mm (r=0.125 mm). The PCF 34 includes silica glass of a glass material, and has a refractive index of is 1.45 with respect to the pulsed light. The high-refractive-index transparent resin of the coating layer 1 can be Lumiplus manufactured by Ryoko Chemical Co., Ltd. The Lumiplus can be molded by UV curing. Also, the coating layer 1 has a refractive index $n_1$=1.65 and transmittance of 80%/mm or more with respect to a wavelength of pump pulsed light. The refractive index of the coating layer 1 is greater than that of the glass material of the PCF 34, and the transmittance of the coating layer 1 is higher than that of the coating layer 2. Since $(r \times n_1)/NA$ is 2.6 mm, it is shorter than the distance L (=9 mm). Further, $(L \times NA)/n_1$ is 0.44 mm and it is thus smaller than the radius R (=1.0 mm) of the coating layer 1. Herein, a divergence diameter $d_{leakage\ light}$ of the leakage light in the end of the coating layer 2 is 0.88 mm, and a $r/(d_{leakage\ light}/2)$ ratio of a radius r (0.125 mm) of the coating layer 2 to $d_{leakage\ light}/2$ is 0.28. This value satisfies a condition of $r/(d_{leakage\ light}/2)$<0.6 on which the leakage light entering the coating layer 2 is 1 W or less. The leakage light entering the coating layer 2 has a power that is estimated to approximately 0.29 W.

Accordingly, the leakage light which does not overlap a cross section surface of the coating layer 2 in the end of the coating layer 2 is released outside from a gap between the coating layer 1 and the coating layer 2. Therefore, according to the wavelength conversion pulsed light source of the second exemplary embodiment, the leakage light (having a power of approximately 2 W) generated in a fusion splice between a PCF and a DCF propagates while diverging inside coating layer 1 having high transmittance. Then, some of the leakage light is released outside in the end of the coating layer 2. The pulsed light entering from the cross section surface of the coating layer 2 and propagating through the coating layer 2 has a power smaller than 1 W. Thus, the coating layer 1 and the coating layer 2 can be prevented from being broken due to heat generated by absorption of the leakage light with high energy density in the coating layer 1 and the coating layer 2. The second exemplary embodiment differs from the first exemplary embodiment as follows. Since an average output of the pulsed light in the second exemplary embodiment is larger than that in the first exemplary embodiment, a limitation is set from a standpoint of the power entering the coating layer 2.

According to the pulsed light source of the second exemplary embodiment, therefore, the leakage light (having a power of approximately 2 W) generated in a fusion splice between the DCF 32 and the PCF 34 propagates while diverging inside the coating layer 1 which has high-transmittance, and some of the leakage light is released outside in the end of the coating layer 2. Further, in the end of the coating layer 2, the leakage light entering the coating layer 2 has a power that is estimated to approximately 0.29 W. This is smaller than 1 W at which a breakage of the coating layer 2 is highly likely to occur. Thus, a power density of the leakage light absorbed by the coating layer 1 and the coating layer 2 (a density of the power of the leakage light to be absorbed) is reduced. As a result, breakages of the coating layer 1 and the coating layer 2 due to generation of heat can be prevented.

In the present exemplary embodiment, the pulsed light from a core of the DCF 32 to a core of the PCF 34 has a coupling efficiency of approximately 60% ($\alpha$=0.6). However, such a coupling efficiency to the core of the PCF 34 fluctuates depending on a condition, such as a pulse width of the pulsed light. The condition, such as a pulsed width of the pulsed light, can be changed due to aging of the wavelength conversion pulsed light source. Thus, the expression below is preferably satisfied to more reliably prevent a breakage of the coating layer 2.

$$P_0\{1-\exp[-2(r/(L(NA/n_1)))^2]\}<1W$$

Figure 3B:
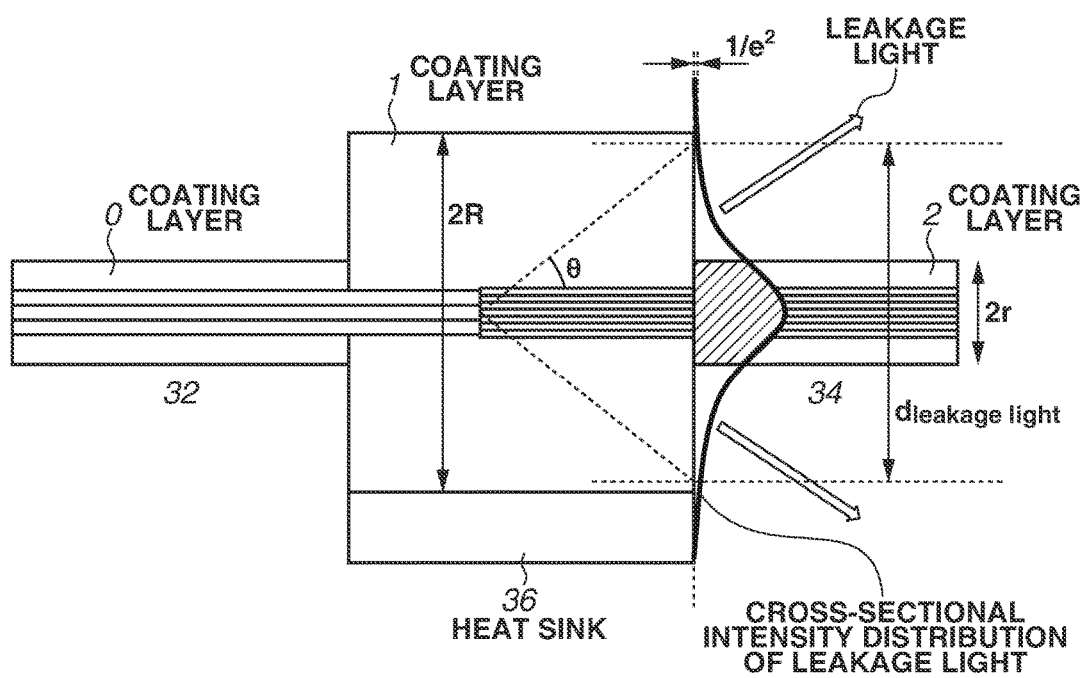

This expression is acquired by applying $\alpha$=0 to the above shown Expression (1). This indicates that a breakage of the coating layer 2 can be prevented even if a coupling efficiency of the pulsed light from the core of the DCF 32 to the core of the PCF 34 is zero. That is, a breakage of the coating layer 2 can be more reliably prevented. Moreover, when the coating layer 1 is in contact with a heat sink 36 as illustrated in FIG. 3B, a breakage of the coating layer 1 can be more prevented. The heat sink 36 exhausts heat that has been generated. The heat sink 36 can be made of a material having thermal conductivity higher than that of the coating layer 1.

According to each of the exemplary embodiments, a breakage of a coating layer can be effectively prevented or reduced.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A fiber structural body comprising:
   a first fiber;
   a second fiber spliced to the first fiber such that light that has propagated through the first fiber propagates through the second fiber;
   a first coating layer;
   a second coating layer; and
   a heat sink,
   wherein one of the first fiber and the second fiber is a photonic crystal fiber and the other of the first fiber and the second fiber is an optical fiber,
   wherein a splice surface between the first fiber and the second fiber is coated with the first coating layer,
   wherein the second fiber is coated with the second coating layer, and
   wherein the heat sink is in contact with the first coating layer and has a thermal conductivity higher than a thermal conductivity of the first coating layer.

2. The fiber structural body according to claim 1, wherein transmittance of the first coating layer is higher than transmittance of the second layer.

3. The fiber structural body according to claim 1, wherein transmittance of the first coating layer is 90%/mm or more.

4. The fiber structural body according to claim 1, wherein the first coating layer includes at least one member selected from the group consisting of UV curing resin, polycarbonate, and sapphire, the UV curing resin including any of acryl resin, epoxy resin, and high-refractive-index polymer.

5. A light source device comprising:
   the fiber structural body according to claim 1; and
   a pulsed light source,
   wherein the pulsed light source, the first fiber, and the second fiber are optically connected such that pulsed light from the pulsed light source propagates through the second fiber after propagating through the first fiber.

6. The light source device according to claim 5, wherein the pulsed light source includes a fiber laser that uses an Ytterbium (Yb)-doped fiber as a gain medium and outputs pulsed light by using mode locking, and an amplifier that uses an Yb-doped fiber as a medium.

7. The fiber structural body according to claim 1, wherein the first coating layer has a refractive index $n_1$ that is larger than a refractive index of a clad layer of the second fiber.

* * * * *